United States Patent [19]

Richardson

[11] 4,258,325

[45] Mar. 24, 1981

[54] THERMOSTAT AND METHOD OF TESTING THEREOF

[75] Inventor: Steven R. Richardson, Mansfield, Ohio

[73] Assignee: Therm-O-Disc, Incorporated, Mansfield, Ohio

[21] Appl. No.: 40,996

[22] Filed: May 21, 1979

[51] Int. Cl.³ .......................................... G01R 31/02
[52] U.S. Cl. .............................. 324/417; 324/158 F; 337/347
[58] Field of Search ............... 337/354, 348, 347, 367; 324/158 F, 424, 417, 73 AT

[56] References Cited
U.S. PATENT DOCUMENTS

| | | | |
|---|---|---|---|
| 3,248,501 | 4/1966 | Hire | 200/122 |
| 3,451,028 | 6/1969 | Schmitt | 337/343 |
| 3,573,700 | 4/1971 | Schmitt | 337/347 |
| 3,670,283 | 6/1972 | Holden | 337/354 |
| 3,675,178 | 7/1972 | Place | 337/348 |
| 3,861,032 | 1/1975 | Schmitt | 337/367 |
| 3,947,758 | 3/1976 | Sutton | 324/317 |

FOREIGN PATENT DOCUMENTS 1172386 11/1969 United Kingdom .................... 337/354

*Primary Examiner*—David K. Moore
*Attorney, Agent, or Firm*—Pearne, Gordon, Sessions, McCoy & Granger

[57] ABSTRACT

A thermostat is disclosed and claimed in which a totally enclosed switch is operated by a bimetal snap disc. The housing is provided with a small opening through which a testing probe may be inserted to test the gaging of the assembled device. Such opening is closed by a thin adhesively applied closure element, the application of which cannot alter the operation of the thermostat. A method of testing is also disclosed in which the thermostat is essentially fully assembled and then thermally cycled while a probe extends through a small opening to monitor the position of the movable element of the switch to determine the position within the snap range of the disc at which the switch closes. After the testing, the opening through which the testing probe extends is closed to complete the assembly of the device.

11 Claims, 3 Drawing Figures

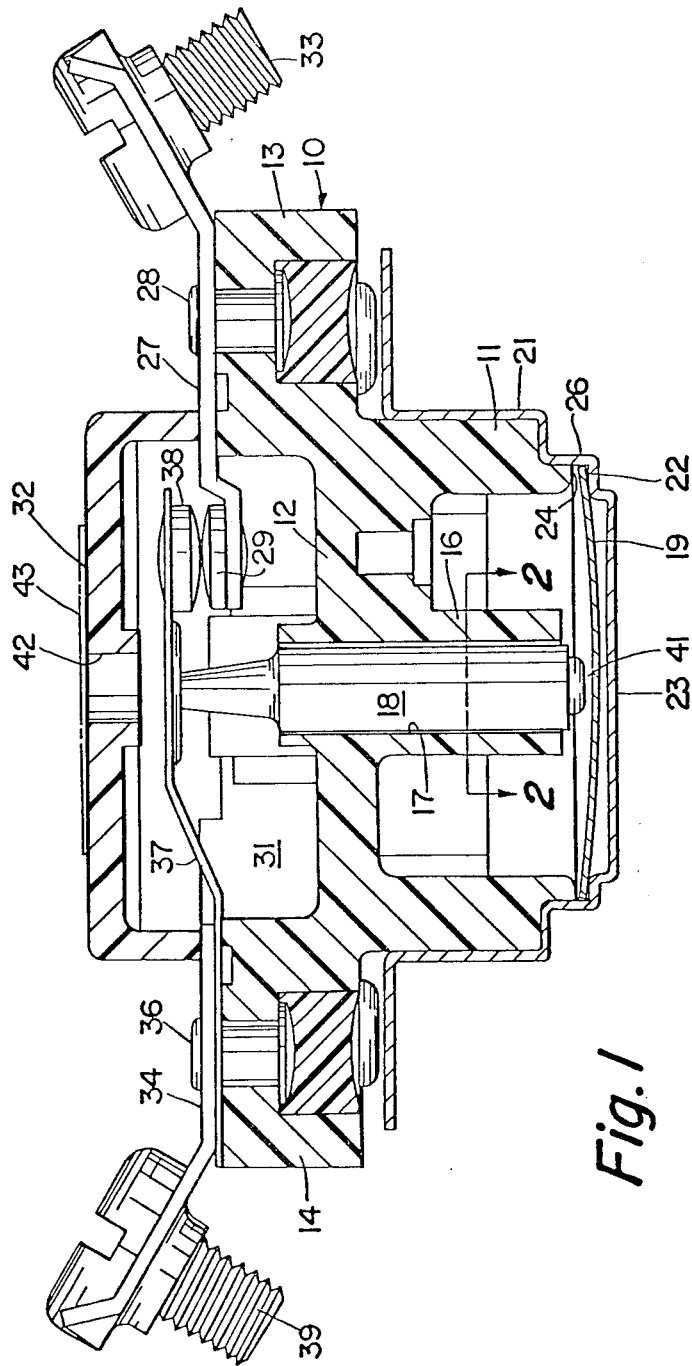
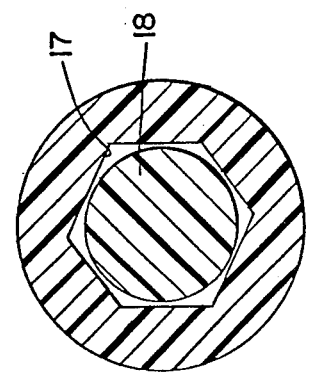
Fig.1
Fig.2

THERMOSTAT AND METHOD OF TESTING THEREOF

BACKGROUND OF THE INVENTION

This invention relates generally to thermostats or the like and, more particularly, to a novel and improved thermostat and to a method of assembling and testing such thermostat.

PRIOR ART

Bimetal snap disc thermostats are well known. Examples of such devices are illustrated in U.S. Pat. Nos. 3,248,501; 3,451,028; 3,573,700; 3,675,178; and 3,861,032, all assigned to the assignee of the present invention. The U.S. Pat. No. 3,861,032 describes a thermostat which does not reset automatically, which is provided with an opening in its cover member through which a probe can be inserted to reset the device after operational testing, and which is subsequently closed.

Usually such devices include a switch which is operated with snap action in response to the snap movement of the disc when the disc reaches its calibration temperatures. During the manufacture of such devices, gaging operations are carefully conducted and parts are assembled either by selective assembly techniques or by other means to produce a device in which the switch is operated within its snap range, (i.e., the range of movement within which the disc moves with snap movement in both directions). If switch operation occurs within the snap range, the switch snaps open and closed and proper switch operation is achieved. Further, the life of the device is determined to a large extent by the location within the snap range at which the switch operates. Therefore, it is desirable to test the assembled device to measure the actual gaging achieved.

In their fully assembled condition, the switches of such devices are often totally enclosed. Consequently, it is often impossible to test the assembled device for proper gaging and switch operation. Preliminary testing of the device and the checking of the gaging if performed prior to final assembly, while access to the switch remains, do not provide a fully reliable test, since the final assembly can result in changes in the mechanism which, in some instances, cause malfunctions that have not existed during the preliminary testing.

SUMMARY OF THE INVENTION

In accordance with the present invention, a novel and improved thermostat structure is provided which allows essentially complete assembly of the device prior to its testing and allows the determination of proper switch operation and measurement of gaging of the assembled device even though the finally assembled device provides a switch which is totally enclosed within the housing assembly.

In accordance with the illustrated embodiment of this invention, a thermostat is provided with a small gaging opening proportioned to receive a probe of testing and measuring equipment and which allows the full testing of the device after it has been essentially fully assembled. After the testing, such gaging opening is closed with a suitable cover element to complete the enclosure of the switch structure. The structure of the cover element and its application are such that there is virtually no possibility of its changing the functional operation or gaging of the assembled device.

The method of testing an assembled device in accordance with the present invention involves the complete assembly of a device which provides a small access opening through which a probe may extend into contact with the movable element of the switch. The device is then thermally cycled to a switch-open condition and a position sensing probe is inserted through the gaging opening into engagement with the movable element of the switch. At the same time, it is preferable to apply a sensing circuit to the terminals of the device to verify the switch-open condition and subsequently verify switch-closing.

The device is then thermally cycled to the switch-closed position while the probe is maintained in engagement with the movable switch element to monitor the movement thereof as the temperature of the disc approaches its operating temperature for movement to the switch-closed position.

When the disc snaps through to the switch-closed position, the movable element of the switch moves almost instantaneously to the switch-closed position. The position of the movable switch element immediately prior to the snap movement is determined by the probe along with the position in the switch-closed condition. Further, the electrical continuity is determined by the separate sensing circuit to determine that the switch is open prior to the snap movement and is closed thereafter.

After the gaging test and functional tests are completed, a thin cover element is preferably applied over the gaging opening to complete the assembly and closure of the device. Such cover element is preferably adhesively applied across the gaging opening in a manner which cannot affect the functioning of the device.

In accordance with this invention, it is possible to completely assemble the device except for the application of the cover element over the gaging opening prior to full testing to ensure that the testing performed accurately establishes the correct operability of the device.

BRIEF DESCRIPTION OF THE DRAWINGS

FIG. 1 is a side elevation, partially in cross section, of a typical bimetal snap disc thermostat in accordance with the present invention;

FIG. 2 is an enlarged, fragmentary cross section taken along 2—2 of FIG. 1; and

DETAILED DESCRIPTION OF THE DRAWINGS

Figure 3:
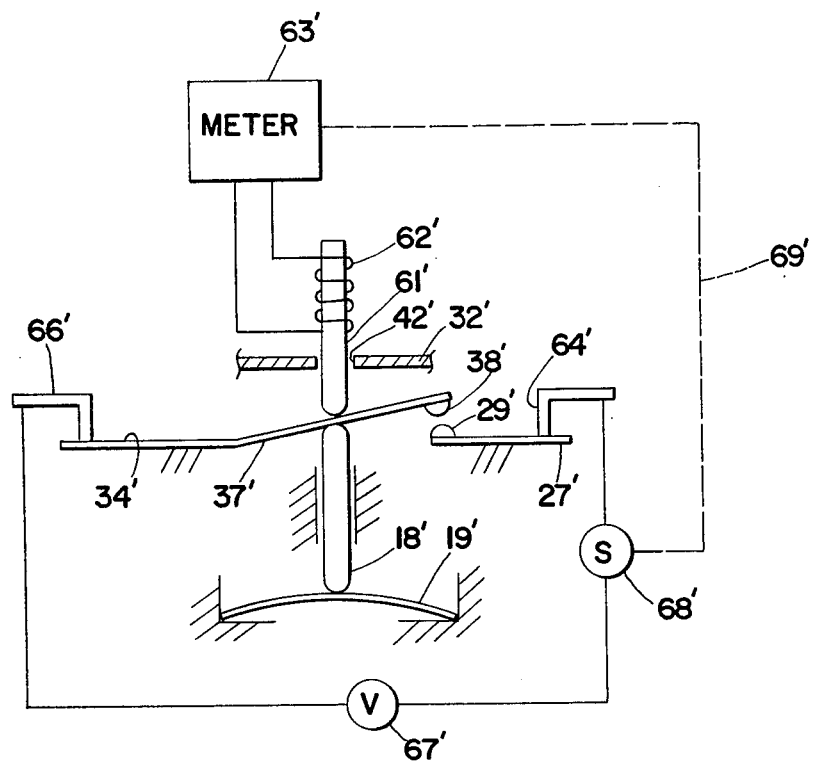
FIG. 3 is a schematic view of the testing system used in the testing in accordance with the present invention.

FIG. 1 illustrates a typical bimetal snap disc-operated thermostat of the type to which the present invention is particularly suited. Such thermostat includes a molded housing 10 formed of suitable plastic, such as a phenolic resin. Such housing includes a generally cylindrical extension 11 extending from a central wall portion 12 and a pair of terminal support portions 13 and 14. A tubular projection 16 extends from the wall portion 12 and a non-circular passage 17 extends through the tubular portion 16 and the central wall 12. The passage 17, in the illustrated embodiment, is provided with a regular hexagonal shape, as best illustrated in FIG. 2. An elongated, generally cylindrical bumper 18 extends through and is guided for axial movement by the passage 17.

Positioned adjacent to the lower end of the cylindrical extension 11 is a bimetal snap disc 19 which is supported and positioned by a metallic disc cup 21. Such disc cup is formed with a peripheral seat 22 which engages the underside of the disc 19 along its periphery. The cup 21 is formed with a central offset 23 to provide clearance with respect to the central portion of the disc 19. The disc 19 is trapped in the proper position between the seat 22 on the disc cup, an end wall 24 on the housing 10, and a cylindrical portion 26 on the disc cup 21.

A first terminal 27 is mounted by a rivet 28 to the terminal support portion 13 and is provided with a stationary contact 29 at one end located within a switch cavity 31 formed by a recess in the housing 10 and a molded plastic cover 32. Suitable means, such as a screw 33, are provided to connect the terminal 27 to an external circuit.

A second terminal 34 is mounted by a rivet 36 to the terminal support portion 14 and is connected to a movable contact support arm 37 which extends in a cantilever fashion across the switch chamber 31 and provides a movable contact 38 adjacent its free end. Here again, a screw 39 is provided on the terminal 34 for connecting such terminal to the external circuit.

The movable contact support arm 37 is formed of electrically conductive spring material and is shaped to resiliently bias the movable contact 38 toward the stationary contact 29, and maintains the two contacts in engagement except when the switch is operated to its open position by the snap disc 19 through the action of the bumper 18. The bimetal snap disc 19 is formed with a shallow dish shape and moves with snap action between two positions of stability in response to temperature changes. In FIG. 1 the disc is illustrated in one position of stability in which it is downwardly curved and when a first predetermined operating temperature is reached, the disc snaps through to its other position of stability in which it is upwardly curved.

The bumper 18 extends between the movable contact support arm 37 and the disc but is sized so that it is not engaged by both the contact support arm and the disc until the disc is in snap movement and is moving from the illustrated position toward its opposite position of stability. In FIG. 1, for purposes of illustration, a clearance is illustrated at 41 between the disc 19 and the end of the bumper 18. However, it should be recognized that if the thermostat is mounted in a position as illustrated, gravity would normally maintain the bumper down against the disc so that such clearance would be present at the opposite end adjacent to the contact support arm rather than the lower end illustrated. The device can operate in substantially any position and it is not critical where the clearances exist prior to the snap action so long as proper clearances are present to ensure that the switch opens at the desired point in the snap range, as more fully described below.

In the illustrated embodiment, the cover 32 is formed with a central gaging opening 42 to provide access to the switch for checking the gaging of the assembled device. Such opening is closed as a final step in the manufacture by a thin cover element 43, which is preferably adhesively applied and may contain suitable identification printing or the like.

Except for the provision of the hexagonal passage 17 and the opening 42, the thermostat thus far described is conventional in its general arrangement. In fact, devices of such general structure have been manufactured by the assignee of the present invention for a considerable period of time.

FIG. 3 schematically illustrates the testing apparatus in use with a thermostat of the type illustrated in FIGS. 1 and 2. For purposes of illustration, only the functioning portions of the thermostat are illustrated. Similar reference numerals will be used to designate similar parts, but with a prime (') added to indicate that reference is being made to FIG. 3.

The disc 19' is supported at its periphery and is illustrated in full line in its upwardly curved position of stability. In such position, the disc 19', through the action of the bumper 18', engages the movable contact arm 37' and maintains the two contacts 38' and 29' separated and the switch is open. A gaging probe 61' extends through the gaging opening 42' in the cover 32' and engages the movable contact arm in alignment with the bumper 18' but on the side thereof opposite thereof. Such probe is longitudinally movable to maintain engagement with the movable contact arm 37' and operates to sense the position of such arm.

Any suitable measuring system for determining the positions of the probe 61' and, in turn, the movable contact arm 37', may be used so long as it does not transmit any substantial force to the arm 37'. One suitable type of measuring system involves a coil 62' positioned around the probe 61', which produces an electrical signal which varies with the position of the probe 61'. The signal from the coil 62' can be transmitted to a suitable meter 63', which is capable of indicating the position and movement of the probe 61'. One suitable type of probe-type sensing and measuring system is marketed by Daytronics, Inc., of Dayton, Ohio, under Model No. DS 200A. However, other suitable devices may be employed.

It is preferable also to test the operation of the switch, and for this purpose a pair of probes 64' and 66' are positioned in engagement with the terminals 27' and 34'. The probes 64' and 66' are connected in a circuit to a voltage source 67' and a sensor 68'. Such sensor 68' can be any suitable device for determining an open circuit condition when the disc is in the illustrated position of FIG. 3 and a closed circuit condition after the disc snaps through to its opposite position of stability. For example, the sensor can be a mere light bulb to give visual indication. On the other hand, if desired, the sensor can be connected to the meter 63' through a line schematically illustrated by the dotted line 69' and, if desired, can be connected in a circuit to correlate switch closure with switch position.

The principal purpose of the gage testing is to establish the gaging of the device, i.e., the point within the snap range of the disc where the switch opens and closes.

One preferred way of conducting the gaging and continuity test is to bring the disc 19' to a temperature at which it snaps through to the upwardly curved position illustrated in FIG. 3 and operates to open the switch. The probe 61' is positioned against the movable contact arm 37' and zeroed at such position. The temperature of the disc is then changed toward the temperature at which the disc will operate with snap movement to its opposite position of stability. The position of the arm is monitored by the position of the probe 61' as the disc creeps toward its snap position, from which it moves with snap action to its opposite position. Reference may be made to U.S. Pat. No. 3,573,700 for a more detailed description of the operation of a bimetal snap disc, and such patent is also incorporated herein by reference.

Once the disc 19' reaches its operating temperature, it commences to move with snap action and almost instantaneously moves through to its opposite position of stability. The position of the arm is determined by the meter 63' immediately prior to the commencement of the snap movement to establish the position of the arm at such instant. When the disc snaps through, the arm moves with snap movement until the two contacts 29' and 38' engages to cause switch closure. The switch closure should occur before the disc completes its snap movement, and within the snap range of the disc. The interengagement between the two contacts 29' and 38' prevents continued movement of the arm 37' and the position of the arm in the switch-closed position is determined by the position of the probe. It should be recognized that there is a certain amount of sag in the arm 37' after switch closure occurs, and this can be established and subtracted from the distance through which the probe moves from the instant snap action commences until switch closure is completed.

Because the geometry of the switch is known, and because the snap range can be established and is known, the results of the test establish the gap which exists between the contacts immediately prior to closing and also the location of closing within the snap range. Further, the continuity test provided by the sensor 68' establishes the proper functioning of the switch to make and break contact.

If desired, the meter 63' can be arranged to establish a range of snap movement of the switch which is considered to be acceptable and can indicate whether the device functions within the range or fails to function within the range to provide a "go" or "no go" type test of the gaging of the completed device. After the device is tested for proper operation and proper gaging, it is removed from the test equipment and the cover element 43 is adhesively applied over the gaging opening 42 to complete the assembly of the device. Preferably, such cover should be such that it cannot extend down through the opening, and therefore cannot alter the operation of the assembled device. Such cover may be, for example, a thin plastic sheet provided with pressure-sensitive adhesive to adhere to the upper surface of the cover 32. Further, such cover element may be provided with suitable indicia to provide on the assembled device any desired information, such as model number or source of manufacture.

The thermostat incorporating the present invention and a method in accordance with the present invention allows the full operational test of a fully assembled device and a determination of the gaging which exists. The invention eliminates the possibilities, for example, that a sealant applied to the joint between the cover 32 and the body might flow in onto the switch mechanism and produce an undetected malfunction.

Although the preferred embodiment of this invention has been shown and described, it should be understood that various modifications and rearrangements of parts may be resorted to without departing from the scope of the invention as disclosed and claimed herein.

What is claimed is:

1. A thermostat comprising a housing assembly, a switch enclosed within said housing assembly, a bimetal snap disc in said housing assembly, and operating means connected between said disc and switch operating said switch in response to movement of said disc while said disc is in snap movement, said housing assembly completely enclosing said switch excepting for a gaging opening sufficient to allow testing of the gaging of said thermostat after said thermostat is fully assembled, and closure means closing and gaging opening after said testing, said gaging opening being located to allow a probe to be inserted into said housing assembly in alignment with said operating means to engage a portion of said thermostat which is moved by said snap disc while said thermostat is being thermally cycled.

2. A thermostat as set forth in claim 1, wherein said closure means is a thin sheet of material adhesively applied to said housing assembly over said gaging opening.

3. A thermostat as set forth in claim 1, wherein said closure means is a sheet of plastic material provided with indicia on one side and a pressure-sensitive adhesive on its other side to secure said closure means to said housing assembly.

4. A method of testing thermostats, including a switch having a movable member operated by a bimetal snap disc after said disc is in snap movement between an open position and a closed position, comprising the steps of fully assembling said thermostat and enclosing said switch except for a gaging opening proportioned to allow a probe to be positioned against a portion of said thermostat which moves when said disc operates, positioning a sensing probe of a measuring means through said opening and against said portion, and thermally cycling said thermostat while said probe is positioned against said portion and determining the position within the snap range at which said switch operates, said probe sensing movement of said portion without materially affecting said movement.

5. A method of testing thermostats as set forth in claim 4, wherein said portion is provided by said movable member of said switch.

6. A method of testing thermostats as set forth in claim 5, wherein said thermal cycling causes said disc to move said switch from its opened position to its closed position while said probe monitors the position of said movable member to determine the position thereof at the moment said switch commences to snap to its closed position, and also the distance to which said movable member moves with snap movement between its open position and its closed position.

7. A method of testing thermostats as set forth in claim 6, wherein a sensing circuit is connected across said switch while said thermostat is thermally cycled to determine that the switch is properly operating.

8. A method of testing thermostats as set forth in claim 7, wherein said measuring means and said sensing means are connected together to indicate that said switch is open when it commences to move with snap movement toward its closed position and that said switch provides electrical continuity only when it reaches its closed position.

9. A method of testing thermostats as set forth in claim 4, wherein a sensing circuit is connected across said switch while said thermostat is thermally cycled to determine that the switch is properly operating.

10. A method of testing thermostats as set forth in claim 9, wherein said measuring means and said sensing means are connected together to indicate that said switch is open when it commences to move with snap movement toward its closed position and that said switch provides electrical continuity only when it reaches its closed position.

11. A thermostat as set forth in claim 1, wherein said switch includes a movable contact arm, said operator means is an elongated bumper which engages and operates said movable contact arm and responds to movement of said snap disc, and said gaging opening is positioned to allow said probe to engage said movable contact arm on the side thereof opposite said bumper.

* * * * *